(12) United States Patent
Ellis et al.

(10) Patent No.: US 7,590,250 B2
(45) Date of Patent: Sep. 15, 2009

(54) ANALOG AUDIO SIGNAL ENHANCEMENT SYSTEM USING A NOISE SUPPRESSION ALGORITHM

(75) Inventors: Richard Thompson Ellis, Phoenix, AZ (US); Heejong Yoo, Atlanta, GA (US); David Wilson Graham, Marlton, NJ (US); Paul Edward Hasler, Atlanta, GA (US); David V. Anderson, Alpharetta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1182 days.

(21) Appl. No.: 10/394,783

(22) Filed: Mar. 21, 2003

(65) Prior Publication Data

US 2004/0013276 A1    Jan. 22, 2004

Related U.S. Application Data

(60) Provisional application No. 60/367,058, filed on Mar. 22, 2002, provisional application No. 60/367,066, filed on Mar. 22, 2002.

(51) Int. Cl.
  *H04B 15/00* (2006.01)
(52) U.S. Cl. .................................. 381/94.3; 381/94.1
(58) Field of Classification Search ....... 381/94.1–94.9, 381/98, 102, 71.1–71.2, 71.8–71.14, 83, 381/93, 80, 95, 96
See application file for complete search history.

(56) References Cited

U.S. PATENT DOCUMENTS

| | | | |
|---|---|---|---|
| 3,180,936 A | 4/1965 | Schroeder | 179/1 |
| 3,403,224 A | 9/1968 | Schroeder | 179/1 |
| 4,783,819 A | 11/1988 | De Koning et al. | 381/83 |
| 4,852,175 A | 7/1989 | Kates | 381/68.4 |
| 5,475,759 A | 12/1995 | Engebretson | 381/68.2 |
| 5,677,987 A | 10/1997 | Seki et al. | 395/2.35 |
| 5,848,171 A | 12/1998 | Stockham, Jr. et al. | 381/321 |
| 5,910,994 A | 6/1999 | Lane et al. | 381/93 |
| 5,986,927 A | 11/1999 | Minch et al. | 365/185.01 |
| 6,177,897 B1 | 1/2001 | Williams, III | 341/150 |
| 6,252,969 B1 | 6/2001 | Ando | 381/103 |

(Continued)

OTHER PUBLICATIONS

Continuous-Time Audio Noise Suppression and Real-Time Implementation—by Heejong Yoo, David V. Anderson, and Paul Hasler, School of Electrical Computer Engineering, Georgia Institute of Technology, Atlanta, GA., 30332—IEEE International Conference on Acoustics, Speech, and Signal Processing, Orlando, FL, vol. 4, pp. 3980-3983, May 2002.

(Continued)

*Primary Examiner*—Xu Mei
(74) *Attorney, Agent, or Firm*—Thomas, Kayden, Horstemeyer & Risley, LLP (57) ABSTRACT

One preferred embodiment of the present invention provides systems and methods for removing noise from an input analog signal in continues time. Briefly described in architecture, one embodiment of the system, among others, can be implemented as follows. An analog filtering system including VLSI circuitry separates an analog input signal into a plurality of sub-band signals. Then, an analog gain system including VLSI circuitry calculates a gain for each sub-band signal that suppresses the noise within the sub-band signal. In some preferred embodiments, VLSI circuitry includes floating gate technology. Methods and other systems are also provided.

20 Claims, 8 Drawing Sheets

U.S. PATENT DOCUMENTS

| | | |
|---|---|---|
| 6,351,731 B1 | 2/2002 | Anderson et al. ............ 704/233 |
| 6,389,377 B1 * | 5/2002 | Pineda et al. .................. 703/4 |
| 6,453,285 B1 | 9/2002 | Anderson et al. ............ 704/210 |

OTHER PUBLICATIONS

A Continuous-Time Speech Enhancement Front-End For Microphone Inputs—by Richard Ellis, Heejong Yoo, David Graham, Paul Hasler, and David Anderson, School of Electrical Computer Engineering, Georgia Institute of Technology—Invited Paper in HP Technical Journal, Accepted Jul. 24, 2002.

Improved Correlation Learning Rule in Continuously Adapting Floating-Gate Arrays Using Logarithmic Pre-Distortion of Input and Learning Signals—by Jeff Dugger and Paul Hasler, Georgia Institute of Technology, Atlanta, GA., 30332-0250 IEE International Symposium on Circuit and Systems, May 26-29, 2002, Scottsdale Princess Resort, Scottsdale, Arizona.

Accurate Programming of Analog Floating-Gate Arrays—by Paul D. Smith, Matt Kucic, and Paul Hasler, Georgia Institute of Technology, Department of Electrical and Computer Engineering, Atlanta, GA., 30332-0250—May 29, 2002 Presentation: Lecture ISCAS 2002.

Analog Speech Recognition Project—by Paul D. Smith and Paul Hasler, Georgia Institute of Technology, Department of Electrical and Computer Engineering, Atlanta, GA., 30332—ICASSP 2002 (International Conference on Acoustics Speech and Signal Processing).

Cooperative Analog-Digital Signal Processing—by Paul Hasler and David V. Anderson, Georgia Institute of Technology, Department of Electrical and Computer Engineering, Atlanta, GA., 30332—ICASSP 2002 (International Conference on Acoustics Speech and Signal Processing).

A Programmable Continuous-Time Floating-Gate Fourier Processor—by Matt Kucic, AiChen Low, Paul Hasler, Member IEEE, and Joe Neff.

A Linear, Time-Varying System Framework for Noniterative Discrete-Time Band-Limited Signal Extrapolation—by Eric J. Diethorn, Member, IEEE, and David C. Munson, Jr., Senior Member, IEEE.

A Subband Noise-Reduction Method for Enhancing Speech in Telephony & Teleconferencing—by Eric J. Diethorn, Lucent Technologies, Inc., Microelectronics & Bell Laboratories, 600 Mountain Avenue, Room 3d543, Murray Hill, NJ, 07974.

* cited by examiner

ANALOG AUDIO SIGNAL ENHANCEMENT SYSTEM USING A NOISE SUPPRESSION ALGORITHM

CROSS-REFERENCE TO RELATED APPLICATION

This application claims priority to copending U.S. provisional applications entitled, "A Continuous-Time Speech Enhancement System in CMOS Using a Noise Suppression Algorithm," having Ser. No. 60/367,058, filed Mar. 22, 2002, which is entirely incorporated herein by reference, and "Capacitively-Coupled Current Conveyer Second-Order Section," having Ser. No. 60/367,066, filed Mar. 22, 2002, which is entirely incorporated herein by reference.

TECHNICAL FIELD

The present invention is generally related to signal processing and, more particularly, is related to noise suppression.

BACKGROUND OF THE INVENTION

Audio signal enhancement by removing additive background noise from a corrupted noisy signal has recently received increased attention due to the prosperity of portable communication devices. Traditional methods of noise suppression include spectral subtraction, Wiener filtering, and a number of modifications on these methods that increase the intelligibility of the processed audio signal and/or reduce adverse artifacts.

A common model for a noisy signal, x(t), is a signal, s(t), plus additive noise, n(t), that is uncorrelated with the signal $$x(t) = s(t) + n(t). \quad \text{(Equation 1)}$$

A common goal in noise suppression is to design a real-time system that generates some optimal estimate, ŝ(t), of s(t) from x(t). By assuming that the additive noise is stationary over a long time period relative to the short term non-stationary patterns of normal speech, an estimate of s(t) may be found in the frequency domain using spectral subtraction or Wiener filtering.

The basic Wiener gain is found from the power spectral densities (PSD) or from the estimated PSD as $$H(\omega) = \frac{\phi_s(\omega)}{\phi_n(\omega) + \phi_s(\omega)}. \quad \text{(Equation 2)}$$

This can also be expressed as a function of the frequency dependent signal-to-noise ratio (SNR) as $$H(\omega) = \frac{\Gamma^2(\omega)}{1 + \Gamma^2(\omega)}, \quad \text{(Equation 3)}$$

where $\Gamma^2(\omega) = \frac{\phi_s(\omega)}{\phi_n(\omega)}$.

A bank of band-pass filters break the input noisy signal into sub-band signals. At each sub-band, the envelope detection of band-limited signal $x_k(t)$ is performed and averaged to provide a smooth estimation of the envelope and followed by noise level estimation. Gain computation at each band is performed using non-linear gain function with each band's a posteriori SNR. For simplicity, we abbreviate a posteriori SNR as SNR. The unmodified band-limited signal, $x_k(t)$, is then multiplied by the calculated gain to obtain the noise suppressed band-limited signal, $ŝ_k(t)$. All of the $ŝ_k(t)$ sub-band signals are summed to build the full-band signal estimate, ŝ(t), after the synthesis filter bank.

Although the current framework of immediately digitizing an incoming analog audio signal seems to be working well in current practice and is primarily driven by transistor scaling and flexibility of programmability. The increasing proliferation of portable electronics has increased emphasis on low-power systems. Functionality, and therefore the amount of signal processing possible, is often constrained primarily by a fixed power budget. Second, the system demands on current systems require very high resolution/high performance analog to digital (A/D) converters. Therefore, the resulting A/D converter block is often consuming a large fraction of the power budget, as well as system design time. Scaling will not help much in this case, since resolution has been increasing at approximately 1.5 bits/5 years at the same performance, and quickly running into additional physical limits which might further slow this progress.

For example, Adaptive Wiener filtering typically requires extensive computation time on current microprocessors which requires a lot of power (e.g., 4 million instructions per second). This is more power than a portable communication device, like a personal digital assistant (PDA) or other personal communication or computing device may be able to provide. Thus, a heretofore unaddressed need exists in the industry to address the aforementioned deficiencies and inadequacies.

SUMMARY OF THE INVENTION

One preferred embodiment of the present invention provides systems and methods for removing noise from an input analog signal in continuous time. Briefly described in architecture, one embodiment of the system, among others, can be implemented as follows. An analog filtering system including very large scale integration (VLSI) circuitry separates an analog input signal into a plurality of sub-band signals. Then, an analog gain system including VLSI circuitry calculates a gain for each sub-band signal that suppresses the noise within the sub-band signal. In some preferred embodiments, VLSI circuitry includes floating gate technology.

The present invention can also be viewed as providing methods for suppressing noise in an analog signal in continuous time. In this regard, one embodiment of such a method, among others, can be broadly summarized by the following steps: separating an input analog signal into sub-band analog signals; determining a gain for each sub-band signal that shall suppress the noise for that sub-band signal; and applying the gain to each sub-band signal to suppress the noise. In preferred embodiments, the steps are implemented using VLSI circuitry, such as floating gate technology. Because the method involves analog processing rather than digital, benefits from its implementation are extremely low power consumption and real time computation.

Other systems, methods, features, and advantages of the present invention will be or become apparent to one with skill in the art upon examination of the following drawings and detailed description. It is intended that all such additional systems, methods, features, and advantages be included within this description and be within the scope of the present invention.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1:
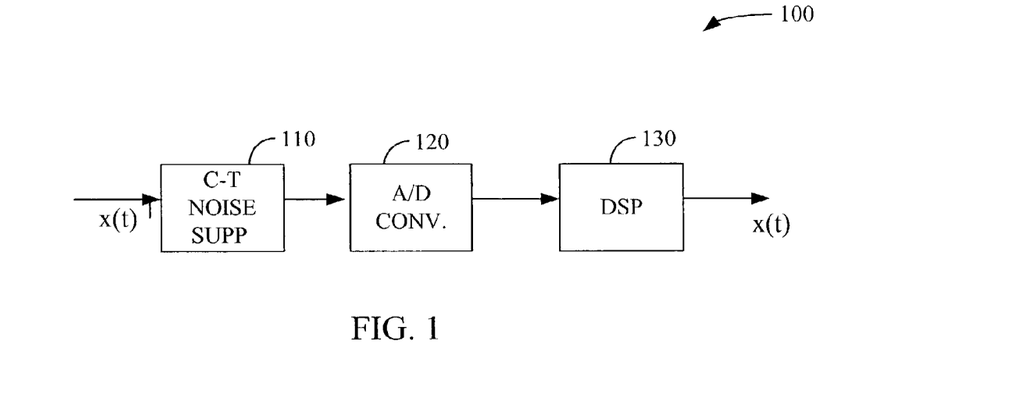
FIG. 1 is block diagram of a cooperative signal processing system of the present invention.

While most noise suppression techniques focus on the processing of discrete-time audio signals, FIG. 1 presents a cooperative signal processing system 100 in which the processing is performed on an analog audio signal prior to the analog/digital (A/D) conversion. By performing this significant portion of the processing in low-power analog circuits, the overall functionality of the system 100 is enhanced by utilizing analog/digital computation in a mutually beneficial way.

As shown in FIG. 1, the cooperative signal processing system 100 includes a continuous-time noise suppression system 110. The continuous-time noise suppression system 110 suppresses the noise evident in an analog signal x(t), such as an output of a microphone, before the analog signal x(t) undergoes analog to digital (A/D) conversion by an A/D converter 120. By performing analog signal processing on the signal x(t) before it is converted to digital, the computation load on a digital signal processor (DSP) 130 is reduced. Further, the analog signal x(t) may provide more refined information to the digital processor than simple data samples such as Fourier coefficients, phonemes, etc.

The continuous-time suppression system 110 utilizes sub-band processing of analog signals and the computational strengths of analog very large scale integration (VLSI) systems, such as complementary metal oxide semiconductor (CMOS) floating gate circuits, to operate in real time using extremely low amounts of power. For example, analog floating gate circuit technology allows each circuit to be programmable/tunable. Consequently, individual circuit elements can be very small, since they do not require the extensive overhead of building perfectly matched circuits or of designing circuits tuned via external inputs.

Figure 2:
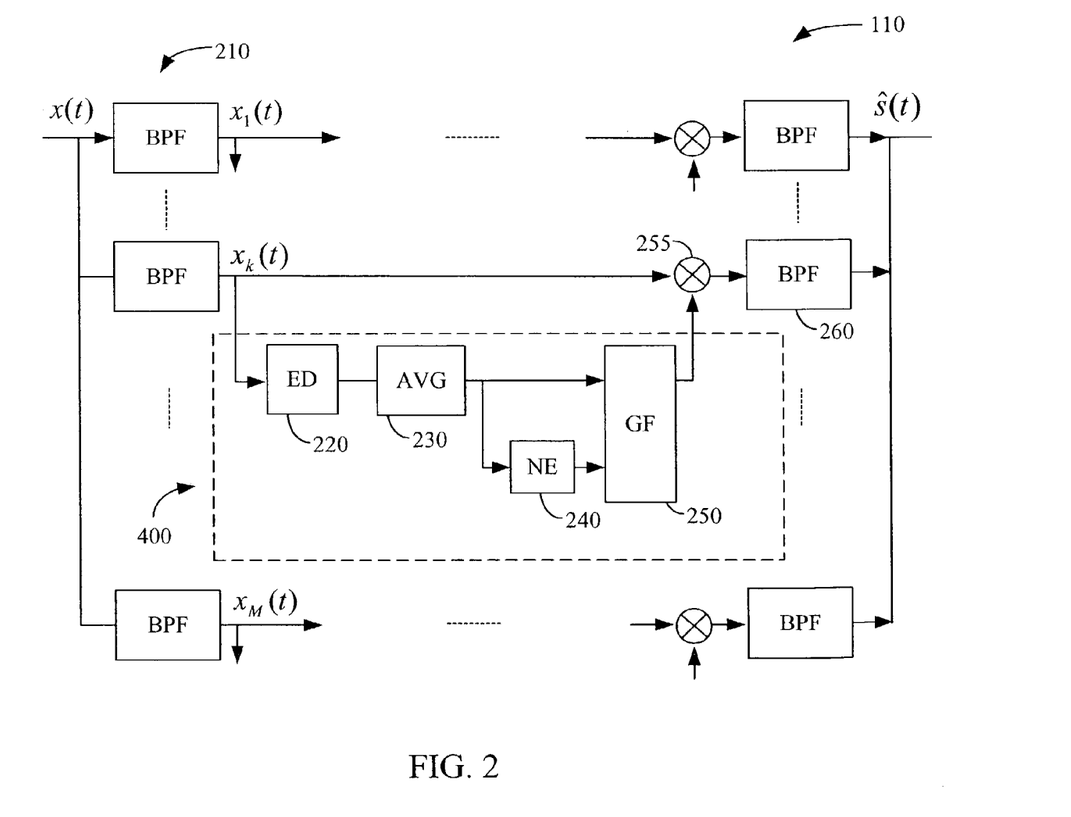
FIG. 2 is a block diagram of a continuous-time noise suppression system in FIG. 1.

FIG. 2 shows the structure of the continuous-time noise suppression system 110 for real-time implementation for one embodiment of the invention. As shown, a bank of band-pass filters 210 breaks the input noisy signal x(t) into sub-band signals $x_k(t)$. In each band, the envelope of the noisy signal is detected and smoothed by an envelope detector 220 and averaging circuit 230. Alternatively, envelope can be detected by squaring the incoming signal and low pass filtering it.

From the smoothed sub-band signal envelope, the noise envelope is estimated in each sub-band by a noise estimator 240. Then, the signal-to-noise ratio (SNR) in each band is estimated from the noisy signal and noise envelopes. A nonlinear (sigmoid) gain function 250 is used to approximate the Wiener gain in this particular embodiment. However, other gain functions may be used, such as a bi-linear gain function, among others. Next, the original band-limited signal in each band is multiplied by the respective gain and the result is summed to construct the full-band "clean" signal estimate $\hat{s}(t)$. Finally, the signal estimate $\hat{s}(t)$ is passed through a band pass filter 260 to remove any out of band noise that was introduced through prior processing. Floating-gate circuits are preferably used in the devices of FIG. 2 to set bias points and adjust offsets (i.e., tuning).

For this embodiment, the filter bank 210 separates the noisy signals into 32 bands that are logarithmically spaced in frequency, similar to the human auditory system, for frequency domain processing. The filters used in the filter bank 210, for this particular preferred embodiment, are the Capacitively-Coupled Current Conveyor Second-Order Sections ($C^4$ SOS), shown in FIG. 3. The $C^4$ SOS 300 is composed of three $C^4$s in the fashion of an Autozeroing Second Order Section (AutoSOS) with bandpass filters. The multiple $C^4$s enhance the characteristics of a single $C^4$ by itself.

Figure 3:
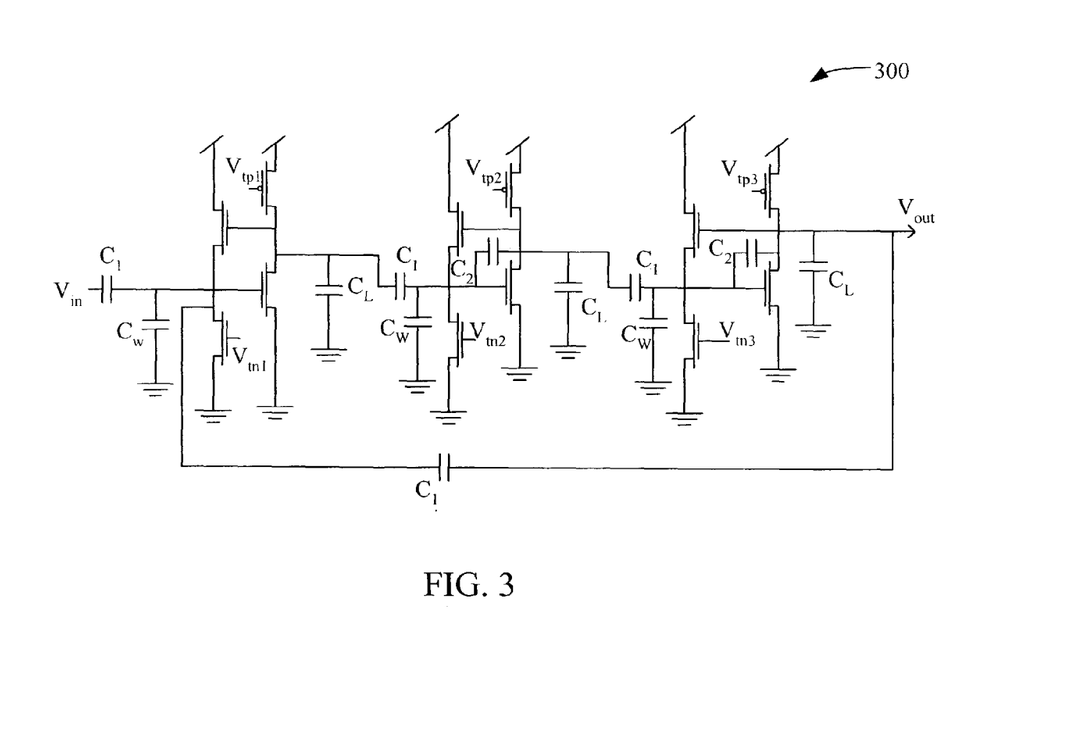
FIG. 3 is a circuit diagram of an embodiment of a filter used in FIG. 2.

Accordingly, additional embodiments of the invention may include more or less than three $C^4$s in a filter 300.

Advantageously, the $C^4$ SOS 300 can readily be placed into a mode of operation in which it produces second-order effects. More specifically, this filter can have a frequency response of any defined bandwidth, and outside that bandwidth, slopes of ±40 dB/decade or greater occur. By adjusting the voltage biases, the response at either corner can be tuned to have a sharp transition or even a Q peak. A high Q peak is useful because it helps isolate the respective center frequency.

Second-order sections, such as the $C^4$ SOS 300, are fundamental building blocks for creating higher-order filters on integrated circuits, and they have been shown to be useful in forming models of the cochlea (inner ear). An array of these bandpass second-order sections 300 can be used to create a silicon cochlea that is able to closely model the resonant properties of the human cochlea and can thus be used as a biologically-inspired audio signal processor in the continuous-time domain.

The bias voltages for the $C^4$ SOS 300, in some embodiments, may be set using a resistive-divider network, which creates a logarithmically spaced filter bank. However, preferred embodiments implement floating gate elements instead of resistors to allow for programming and improved tuning. The biases can then be tuned to achieve a moderate Q peak, mirroring biology.

Figure 4:
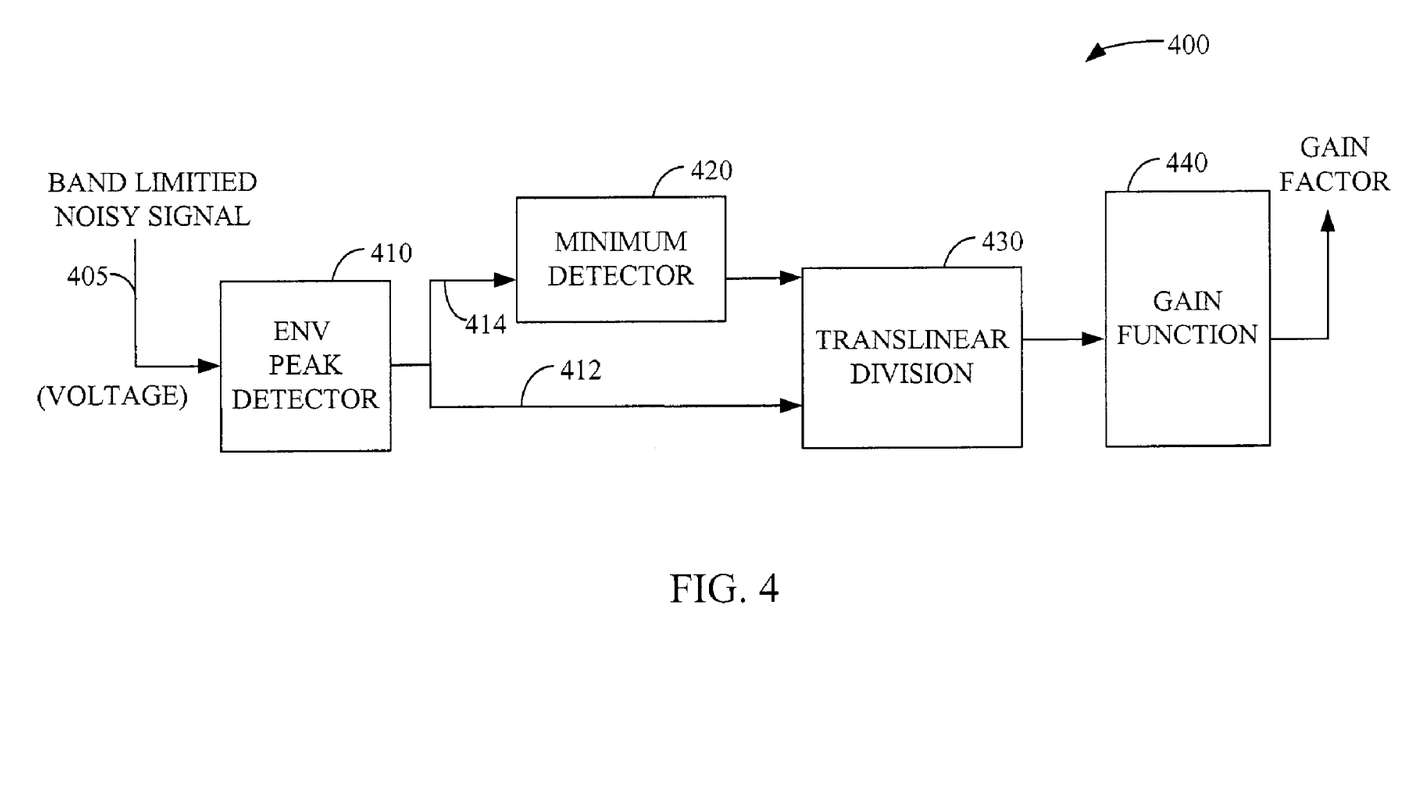
FIG. 4 is a block diagram of a sub-band gain calculation component of FIG. 2.

FIG. 4 details the sub-band gain calculation component 400 of the continuous-time noise suppression system 110 for one embodiment of the invention. The gain calculation circuits 400 make up the processing block for the system 110. Each block operates independently of the others in the array, so effectively, there are 32 parallel signal processors operating simultaneously on 32 band-limited signals.

Within each frequency band, the levels of the noisy signal and the noise are estimated. The noisy signal envelope is estimated using a peak detector 410. It is nearly impossible to accurately estimate the actual signal component of the incoming signal 405, so the process carried out by the peak detector 410 is framed to use the noisy signal 412.

Figure 5:
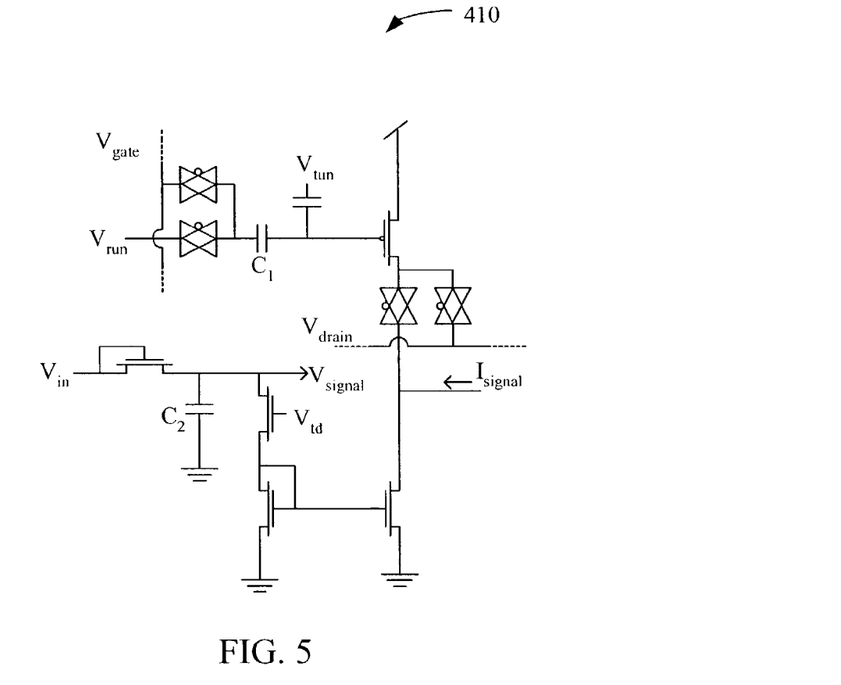
FIG. 5 is a circuit diagram of an embodiment of a peak detector used in FIG. 4.

FIG. 5 shows one preferred embodiment for the peak detector 410. Here, the noisy signal level is estimated by tracking the incoming band-limited signal. The bias voltage $V_{td}$ sets the time constant at which the output will decay after a peak. When a speech signal is input, the peak detector 410 follows the envelope of the signal, rising rapidly with the increasing signal amplitude and decaying slowly enough to result in a smooth envelope. The peak detector 410 also follows the level of the additive noise, particularly in times where the signal is absent. The circuit 410 outputs both a voltage $V_{signal}$ and current $I_{signal}$ that are representative of the noisy signal level 412. The current $I_{signal}$ goes into the noise estimator circuit 430, while the voltage $V_{signal}$ is the input to the minimum detector 420.

Figure 6:
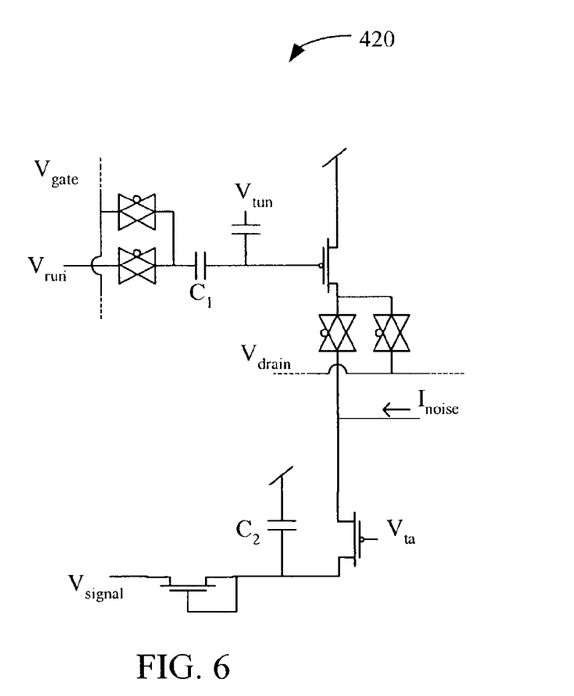
FIG. 6 is a circuit diagram of an embodiment of a minimum detector used in FIG. 4.

The circuit shown in FIG. 6 is a minimum detector 420 and is used to estimate the noise level in the signal for one preferred embodiment of the invention. The input to the minimum detector 420 is the voltage output of the peak detector 410.

Accordingly, the noise level is estimated by following the minimum values of the noisy signal envelope. The bias voltage $V_{ta}$ sets the attack time constant and is set to run much slower than the peak detector 410 in order to follow the slow changes found in the amplitude of stationary noise. The output $I_{noise}$ is an estimate of the noise level.

In both of these circuits 410, 420, the floating gate pFET device shown at the top of the schematics is used for offset cancellation. When the input is set to a particular bias voltage, around which the signal modulates, a certain amount of current is produced at the output node. The floating gate is programmed in a such as way as to cancel this offset current, causing zero current at the output node until a signal is present. The current outputs of the peak 410 and minimum 420 detectors are the inputs to the noise estimator component 430.

Figure 7:
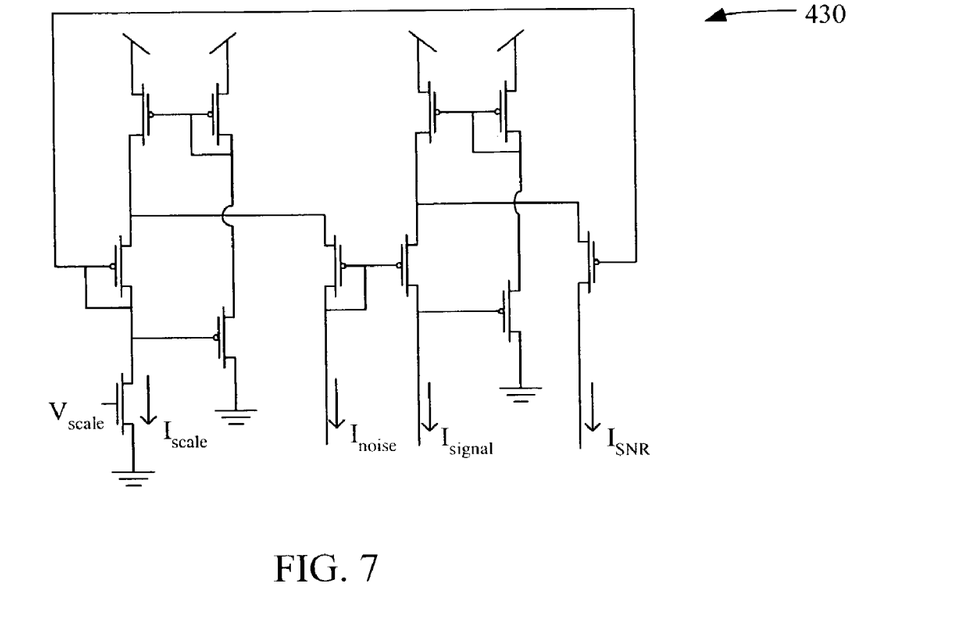
FIG. 7 is a circuit diagram of an embodiment of a translinear circuit used in FIG. 4.

For a preferred embodiment, the translinear circuit 430 shown in FIG. 7 is used as the noise estimator component by determining a SNR value for the noisy signal x(t) from the inputs provided by the peak 410 and minimum 420 detectors. An estimation of the a posteriori signal-to-noise ratio (SNR) is defined by a ratio of the envelopes of the signals, $$S\hat{N}R = \frac{e_{\hat{x}}(t)}{e_{\hat{n}}(t)} \approx \frac{e_{\hat{x}}(t) - e_{\hat{n}}(t)}{e_{\hat{n}}(t)} = \frac{e_{\hat{x}}(t)}{e_{\hat{n}}(t)} - 1 \quad \text{(Equation 4)}$$

where $e_x(t)$ is the noisy signal envelope estimate, which is approximately represented by the sum of the actual signal envelope $e_s(t)$ and the noise envelope estimate $e_n(t)$.

Multiplication and division operations can be performed using the translinear principle. The translinear circuit 430 shown in FIG. 7 performs a division operation where the output, $I_{SNR}$, can be represented by the following equation:

$$I_{SNR} = I_{scale}\frac{I_{signal}}{I_{noise}} - I_{scale} \quad \text{(Equation 5)}$$

and represents the estimated SNR. The current $I_{scale}$ is set by the bias voltage $V_{scale}$ and is used to put the output current into the proper range for the gain function device 440.

The gain function device 440 calculates the gain ("gain factor") and applies the gain factor to the band-limited signal to realize noise suppression. The gain factor may be expressed as a function of the SNR. Several different gain functions may be used but all of them have the general characteristics of low gain for low SNR and high gain (at or near unity) for high SNR, with varying smoothing between these two regions. The transition between low gain and high gain preferably should be smooth to avoid adverse auditory effects, yet it should also quickly follow the SNR changes to ensure an acceptable amount of noise suppression.

Figure 8:
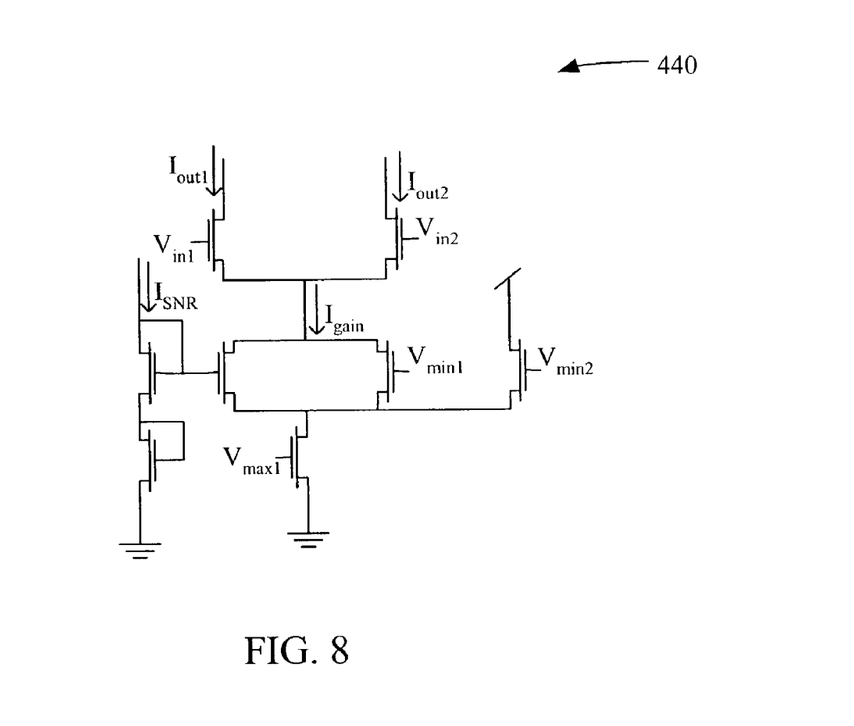
FIG. 8 is a circuit diagram of an embodiment of a gain function device used in FIG. 4.

In one preferred circuit implementation 440, the gain function device also includes a multiplier 255, as shown in FIG. 8. The transistors at the top of the schematic are the differential pair where the actual multiplication takes place. The transistors below the differential pair create the behavior of the gain function. The output of the gain function circuit is $I_{gain}$, which can be approximated by $$I_{gain} = \frac{(I_{SNR}^2/I_0 + I_{min\,1})I_{max}}{(I_{SNR}^2/I_0 + I_{min\,1}) + I_{max}}, \quad \text{(Equation 6)}$$

where $I_{max}$ and $I_{min1}$ are set by the voltage biases $V_{max}$ and $V_{min1}$ and effectively create the upper and lower bounds of the gain factor output. The voltage bias $V_{min2}$ can be used to further adjust the range of input current that the circuit will accept. The diode connected transistor on the input branch of the circuit causes the current that is mirrored onto the gain branch to be squared; this is important to ensure a quick transition from low to high gain as $I_{SNR}$ increases.

The multiplication portion of the circuit 440 results from the interaction between the inputs to the differential pair $V_{in1}$ and $V_{in2}$ and the gain factor current $I_{gain}$ from the gain function portion of the circuit 440. The circuit 440 is biased to operate in the linear range of the following equation:

$$I_{out1} - I_{out2} = I_{gain}\tanh\frac{\kappa(V_{in1} - V_{in2})}{2U_T} \quad \text{(Equation 7)}$$

(where $U_T$ is the thermal voltage of the transistors). The input to the multiplier 255 is the band-limited noisy signal, i.e. the output of the $C^4$ SOS bandpass filter. Because this embodiment is single-ended rather than differential, the "negative" input voltage, $V_{in2}$, is held constant. (Note, a differential embodiment is discussed later.) The output current, $I_{out1} - I_{out2}$, is the product of the band-limited input signal, $V_{in1} - V_{in2}$, and the gain factor, $I_{gain}$.

Figure 9:
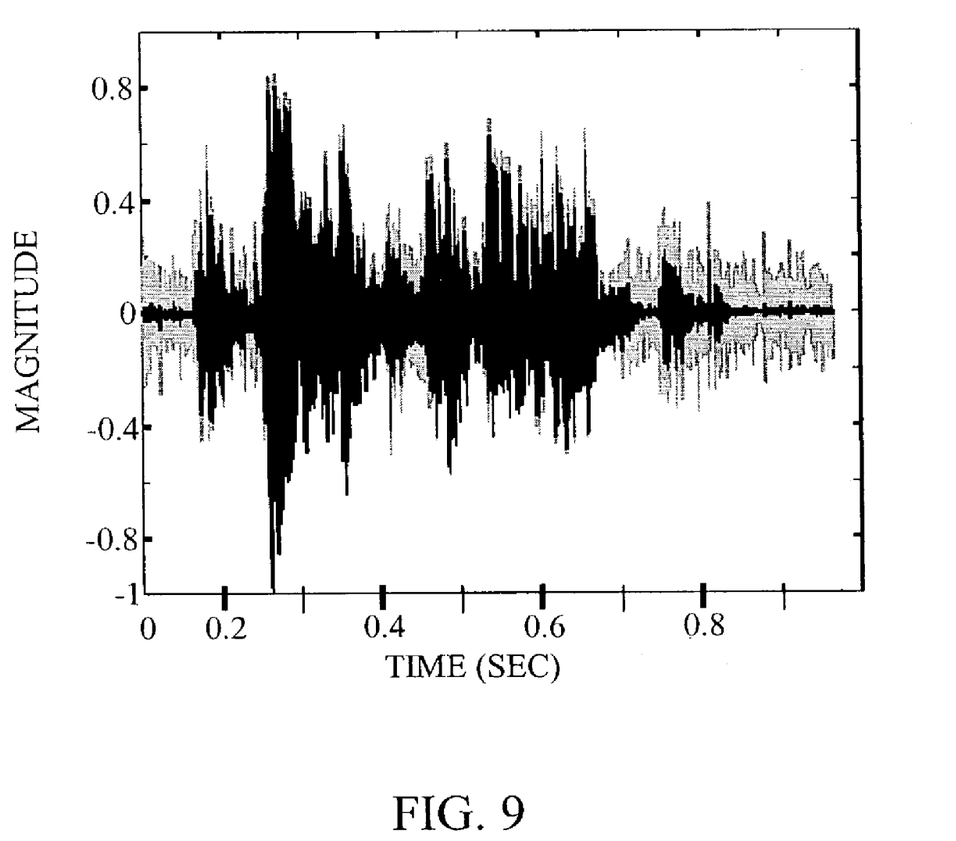
FIG. 9 is a graph of a noisy speech signal that has been processed by the embodiment of the system in FIG. 2

FIG. 9 shows a noisy speech signal that has been processed by the components in the system 110. The light gray data is a noisy speech input signal; the black waveform is the output of one of the frequency bands, after the gain function has been applied. Any noise or distortion created by the gain calculation circuits 440 minimally affects the output signal because these circuits are not directly in the signal path. While the bandpass filters 260 and the multipliers 255 will inject a certain amount of noise into each frequency band, this noise will be averaged out by the summation of the signals at the output of the system 110.

Figure 10:
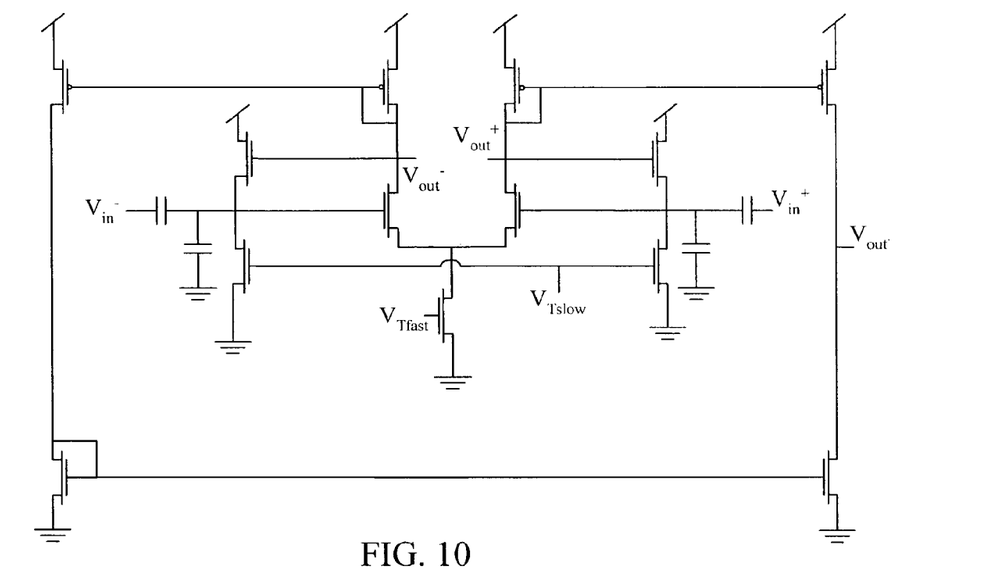
FIG. 10 is a circuit diagram of an embodiment of a filter used in FIG. 2 having a differential input and a single-ended output.
Figure 11:
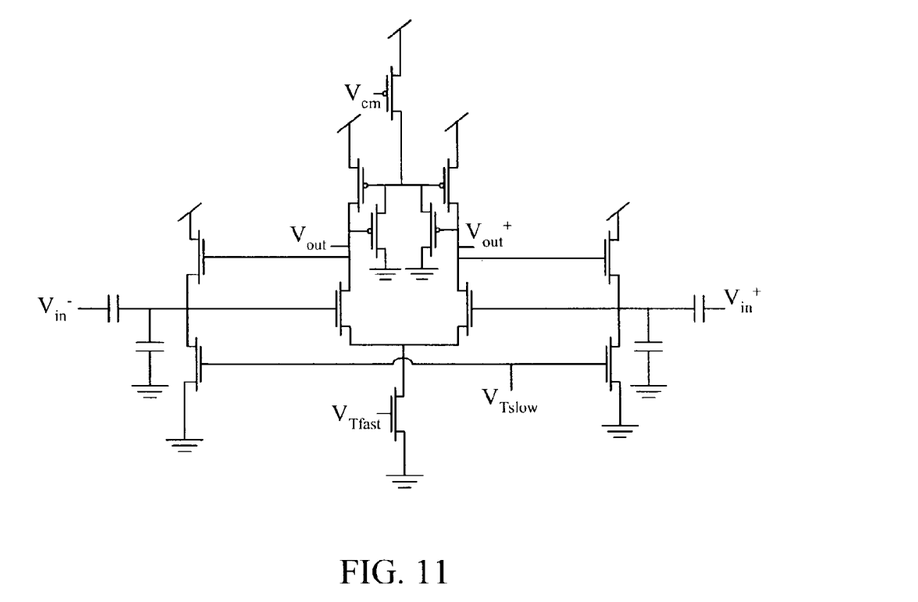
FIG. 11 is a circuit diagram of an embodiment of a filter used in FIG. 2 having differential input and output.

Some preferred embodiments of the invention utilize differential versions of the $C^4$ SOS by building two $C^4$'s into a differential pair. Additionally, two different loads to the differential pair can give two different circuits. To achieve a single-ended output, a current-mirror load can be used, as shown in FIG. 10. Alternatively, to have differential outputs as well as differential inputs, a load that consists of common-mode feedback can be used. This circuit is shown in FIG. 11.

For a bandpass filter array encompassing the $C^4$ SOS circuit of FIG. 3, the distortion level in each frequency band for a 30 mV single-ended input signal is a 2nd harmonic limited at −30 dB at peak. Correspondingly, a differential filter bank utilizing the circuit of FIG. 10 or 11 can eliminate 2nd harmonic distortion and can reduce the 3rd harmonic level to −40 dB at peak. Note, the distortion introduced by the multiplier is dependent on the output levels of the bandpass filters. As a result, if the signal is near 30 mV, the 3rd harmonic distortion is −20 dB down; however, if the signal is near 7.5 mV, the 3rd harmonic distortion approaches −46 dB.

By utilizing analog signal processing at the front-end of a signal processing system 100, the A/D converter complexity and the overall system complexity are reduced. Circuit size constraints also favor analog VLSI circuits in many cases. It is often possible to take advantage of device physics to perform complex operations with only a very few transistors. For example, an analog multiplier can store the coefficient and perform the multiplication using only as many transistors as would be needed to store a four bit coefficient in digital memory.

Figure 12:
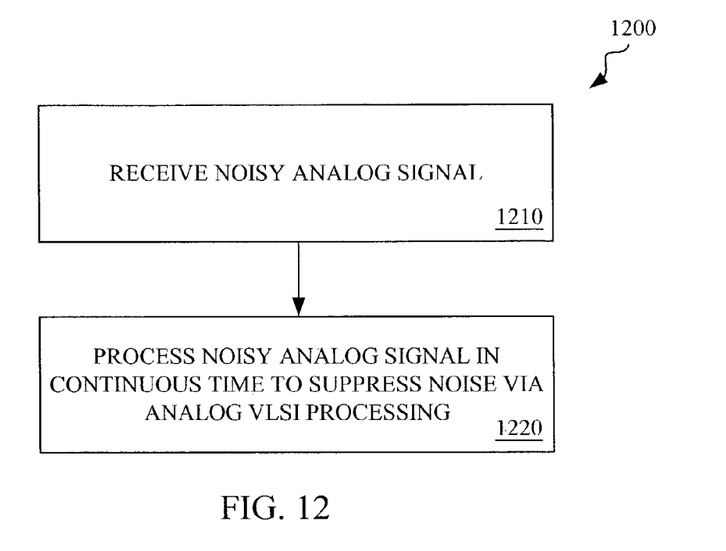
FIG. 12 is a flowchart describing the functionality of the system of FIG. 1.

The flowcharts of FIG. 12 show the functionality of a representative implementation of the cooperative signal processing system 100 of the present invention. As depicted in FIG. 12, the functionality of a representative embodiment of the cooperative signal processing system 100 or method 1200 may be construed as beginning at block 1210. In block 1210, a noisy analog signal is received (from a microphone output, for example). Then, in block 1220, the noisy analog signal undergoes continuous-time analog VLSI signal processing to suppress the noise in the analog signal. In a preferred implementation of the invention, analog processing is implemented using CMOS floating gate circuitry. Next, the analog signal may undergo additional processing such as A/D conversion and digital signal processing.

Figure 13:
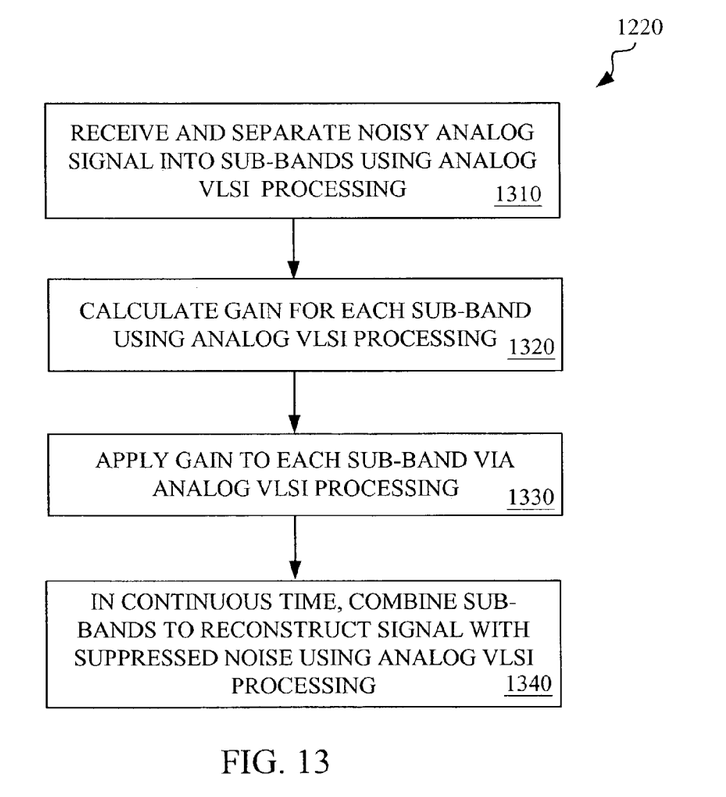
FIG. 13 is a flowchart describing an embodiment of the process for continuous-time analog signal processing in FIG. 12.

One implementation for the continuous-time analog signal processing 1220 is described in FIG. 13. Here, in step 1310, a noisy signal is received and separated, via real time analog VLSI signal processing, into narrow sub-bands that are exponentially spaced in frequency, similar to the human auditory system for frequency domain processing using analog circuitry. In a preferred implementation, the signal is separated using $C^4$ SOS band pass filters.

Based on the observed sub-band signals and sub-band noise signals, a gain is calculated using analog VLSI circuitry, as depicted in step 1320. Next, the gain is applied to the sub-band signals, and the signals are combined to reconstruct the signal with the noise component significantly via continuous-time analog VLSI signal processing, as shown in steps 1330-1340. Additional, steps (not shown) may include controlling the characteristics of the sub-bands or the gain by programming floating gate circuitry that controls the respective computation or using differential analog signal processing to form the sub-band signals.

The method 1300 is designed to reduce stationary background noise in single-microphone signals while preserving the non-stationary signal component. Because the method 1300 involves analog computation rather than digital, benefits from its implementation are extremely low power consumption and real time computation. The method 1300 may be based on an adaptive Wiener filter algorithm, adapted to take advantage of analog processing capabilities provided by floating-gate analog VLSI circuits. Further, noise suppression processing may be performed on continuous-time signals in one-third octave sub-bands.

Preferred embodiments of the continuous-time noise suppression system 110 and method 1200 are targeted for implementation in a low-power analog computing integrated circuit with floating-gate circuits. This custom analog approach can achieve an increased efficiency (=Bandwidth*Power) by $10^4$ over a custom digital approach, which could enable many applications years ahead of schedule from a purely digital roadmap. This increase in efficiency can be used for reducing the power efficiency of a given problem, or addressing computational problems that are considered intractable by the current digital roadmap. For example, this system 110 and method 1400 may significantly enhance audio inputs on portable devices without adding significant power drain or size.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. For example, alternative embodiments may include different analog implementations of the circuit devices shown. All such modifications and variations are intended to be included herein within the scope of this disclosure and the present invention and protected by the following claims.

Therefore, having thus described the invention, at least the following is claimed:

1. A system for removing noise from an input analog signal comprising:
   an analog VLSI filtering system for separating the input analog signal having noise into a plurality of sub-band signals; and
   an analog VLSI gain system for determining a particular gain to apply to each particular sub-band signal to suppress the noise in that particular sub-band signal.

2. The system of claim 1, wherein the analog VLSI gain system combines the plurality of sub-band signals into an output analog signal with suppressed noise, the system further comprising:
   an analog to digital converter for receiving the output analog signal and converting the output analog signal with suppressed noise to a digital signal; and
   a digital signal processor for receiving the digital signal and performing digital signal processing on the digital signal.

3. The system of claim 1, wherein the system is comprised of floating gate VLSI circuitry.

4. The system of claim 1, wherein the analog VLSI filtering system is comprised of bandpass filters, each bandpass filter including at least one tunable autozeroing band pass filter.

5. The system of claim 1, wherein the analog VLSI filtering system is comprised of band pass filters, each band pass filter including three tunable autozeroing bandpass filters.

6. The system of claim 1, wherein the analog VLSI filtering system is comprised of bandpass filters, each bandpass filter including at least one differential autozeroing bandpass filter.

7. The system of claim 1, wherein the analog VLSI filtering system models the resonant properties of the human cochlea.

8. The system of claim 1, wherein the analog VLSI gain system comprises:
  an analog peak detector including VLSI circuitry for estimating a noisy signal from the sub-band signal;
  an analog minimum detector including VLSI circuitry for estimating the noise in the sub-band signal;
  an analog translinear divider including VLSI circuitry for estimating a signal-to-noise ratio from the estimations of the noisy signal and the noise; an analog gain function device including VLSI circuitry for calculating the gain; and
  an analog multiplier including VLSI circuitry for applying the gain to the sub-band signal.

9. The system of claim 1, wherein the analog input signal is received from a microphone.

10. The system of claim 1, wherein the gain comprises a non-linear gain.

11. A system for removing noise from an input analog signal in continuous time, comprising:
  analog means including VLSI circuitry for separating the input analog signal having noise into a plurality of sub-band signals; and
  analog means including VLSI circuitry for determining a particular gain to apply to each particular sub-band signal to suppress the noise in that particular sub-band signal.

12. The system of claim 11, the analog VLSI means for determining comprising:
  first analog means including VLSI circuitry for estimating a noisy signal from the sub-band signal;
  second analog means including VLSI circuitry for estimating the noise in the sub-band signal;
  third analog means including VLSI circuitry for estimating a signal-to-noise ratio from the estimations of the noisy signal and the noise;
  fourth analog means including VLSI circuitry for calculating the gain; and
  fifth analog means including VLSI circuitry for applying the gain to the sub-band signal.

13. The system of claim 11, wherein the system is comprised of floating gate VLSI circuitry.

14. A method for removing noise from an input analog signal comprising the steps of:
  separating the input analog signal having noise into a plurality of analog sub-band signals via analog VLSI circuitry; and
  analog processing each sub-band signal to suppress the noise in each sub-band signal via analog VLSI circuitry.

15. The method of claim 14, further comprising:
  combining the plurality of sub-band signals into an analog output signal with suppressed noise via analog VLSI circuitry.

16. The method of claim 14, wherein the noise is suppressed in the input analog signal before the signal undergoes analog to digital conversion.

17. The method of claim 14, further comprising:
  receiving the input analog signal from a microphone.

18. The method of claim 14, further comprising:
  dynamically adjusting the bandwidth of the analog sub-band signals.

19. The method of claim 14, the analog processing step comprising:
  detecting the level of an estimate of a noisy signal from the sub-band signal;
  detecting the level of noise in the sub-band signal;
  determining a signal-to-noise ratio for the sub-band signal;
  calculating a gain based on the signal-to-noise ratio; and
  applying the gain to the sub-band signal to suppress the noise.

20. The method of claim 19, further comprising:
  dynamically adjusting the gain for a particular sub-band signal.

* * * * *

UNITED STATES PATENT AND TRADEMARK OFFICE
CERTIFICATE OF CORRECTION

PATENT NO. : 7,590,250 B2  Page 1 of 1
APPLICATION NO. : 10/394783
DATED : September 15, 2009
INVENTOR(S) : Ellis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1454 days.

Signed and Sealed this

Twenty-first Day of September, 2010

David J. Kappos
*Director of the United States Patent and Trademark Office*